United States Patent
Rahman et al.

(10) Patent No.: US 11,709,434 B2
(45) Date of Patent: Jul. 25, 2023

(54) DEVICE MANUFACTURING METHOD

(71) Applicant: ASML NETHERLANDS B.V., Veldhoven (NL)

(72) Inventors: Rizvi Rahman, Eindhoven (NL); Cornelis Johannes Henricus Lambregts, Geldrop (NL); Wolfgang Helmut Henke, Kempen (DE)

(73) Assignee: ASML NETHERLANDS B.V., Veldhoven (NL)

( * ) Notice: Subject to any disclaimer, the term of this patent is extended or adjusted under 35 U.S.C. 154(b) by 11 days.

(21) Appl. No.: 17/633,781

(22) PCT Filed: Jul. 14, 2020

(86) PCT No.: PCT/EP2020/069814
§ 371 (c)(1),
(2) Date: Feb. 8, 2022

(87) PCT Pub. No.: WO2021/032362
PCT Pub. Date: Feb. 25, 2021

(65) Prior Publication Data
US 2022/0276570 A1 Sep. 1, 2022

(30) Foreign Application Priority Data

Aug. 16, 2019 (EP) .................................... 19192073
Aug. 20, 2019 (EP) .................................... 19192440

(51) Int. Cl.
*G03F 7/20* (2006.01)
*G03F 7/00* (2006.01)

(52) U.S. Cl.
CPC ...... *G03F 7/70633* (2013.01); *G03F 7/70641* (2013.01)

(58) Field of Classification Search
CPC . G03F 7/70633; G03F 7/70641; G03F 7/7045
See application file for complete search history.

(56) References Cited

U.S. PATENT DOCUMENTS 10,303,069 B2 * 5/2019 Sakamoto ............. G03F 9/7042
10,359,367 B2 * 7/2019 Fukazawa ........... G03F 7/70641
(Continued)

FOREIGN PATENT DOCUMENTS

| JP | H10-229039 | 8/1998 |
| TW | 201629617 | 8/2016 |
| WO | 2018197146 | 11/2018 |

OTHER PUBLICATIONS

International Search Report and Written Opinion issued in corresponding PCT Patent Application No. PCT/EP2020/069814, dated Oct. 27, 2020.
(Continued)

*Primary Examiner* — Hung V Nguyen
*Assistant Examiner* — Hung Henry Nguyen
(74) *Attorney, Agent, or Firm* — Pillsbury Winthrop Shaw Pittman, LLP

(57) ABSTRACT

A device manufacturing method including: performing a first exposure on a substrate using a first lithographic apparatus to form a first patterned layer including first features; processing the substrate to transfer the first features into the substrate; and performing a second exposure on the substrate using a second lithographic apparatus to form a second patterned layer including second features, wherein: the first lithographic apparatus has first and second control inputs effective to control first and second parameters of the first features at least partly independently; the second lithographic apparatus has a third control input effective to control the first and second parameters of the second features together; and the first exposure is performed with the first and/or second control input set to pre-bias the first and/or second parameter.

20 Claims, 3 Drawing Sheets

(56) References Cited

U.S. PATENT DOCUMENTS

2012/0008127 A1    1/2012  Tel et al.
2018/0011398 A1    1/2018  Tel et al.
2020/0081353 A1*   3/2020  Simons ............... G03F 7/70633

OTHER PUBLICATIONS

Laidler, D. et al.: "Mix and Match Overlay Optimization Strategy for Advanced Lithography Tools (193i and EUV)", Proc. of SPIE, vol. 8326 (Apr. 25, 2012).
Taiwanese Office Action issued in corresponding Taiwanese Patent Application No. 109125407, dated Jul. 30, 2021.

* cited by examiner

DEVICE MANUFACTURING METHOD

CROSS-REFERENCE TO RELATED PATENTS

This application is the U.S. national phase entry of PCT Patent Application No. PCT/EP2020/069814 which was filed on Jul. 14, 2020, which claims the benefit of priority of European Patent Application No. 19192073.5 which was filed on Aug. 16, 2019 and European Patent Application Ser. No. 19/192,440.6 which was filed on Aug. 20, 2019 which are incorporated herein in their entireties by reference.

BACKGROUND

Field of Invention

The present invention relates to device manufacturing using lithographic apparatus.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Most semiconductor devices require a plurality of pattern layers to be formed and transferred into the substrate. For proper functioning of the device, there is usually a limit on the tolerable positioning error between successive layers. The positioning error between two layers is often referred to as overlay. With the continual desire in the lithographic art to reduce the size of features that can be formed (shrink) the limits on overlay are becoming stricter.

Overlay can arise from a variety of causes in the lithographic process, for example errors in the positioning of the substrate during exposure and aberrations in the projected image. Overlay can also be caused during process steps, such as etching, which are used to transfer the pattern into the substrate. Some such process steps generate stresses within the substrate that lead to local or global distortions of the substrate. The formation of three dimensional structures on the substrate, such as is required for recently developed memory types and MEMS, can also lead to significant distortions of the substrate.

There are of course also limits on the tolerable errors of other imaging parameters and patterning metrics, such as focus, dose, CD, CDU, line-edge roughness, etc. There are a variety of sources of error in imaging parameters and patterning metrics some of which may give rise to multiple different forms of error.

SUMMARY OF THE INVENTION

The present invention aims to provide improved lithographic device manufacturing processes.

According to an embodiment of the invention there is provided a device manufacturing method comprising:

performing a first exposure on a substrate using a first lithographic apparatus to form a first patterned layer comprising first features;

processing the substrate to transfer the first features into the substrate; and performing a second exposure on the substrate using a second lithographic apparatus to form a second patterned layer comprising second features; wherein:

the first lithographic apparatus has first and second control inputs effective to control first and second parameters of the first features at least partly independently;

the second lithographic apparatus has a third control input effective to control the first and second parameters of the second features together; and the first exposure is performed with at least one of the first and second control inputs set to pre-bias at least one of the first and second parameters so as to achieve a value of a characteristic of at least one of the first and second features that is not achievable using the third control input alone.

According to an embodiment of the invention there is provided a method for determining parameters to be used in device manufacturing process in which a first exposure is performed on a substrate using a first lithographic apparatus to form a first patterned layer comprising first features and a second exposure is performed on the substrate using a second lithographic apparatus to form a second patterned layer comprising second features, the method comprising:

obtaining metrology data relating to exposures of the first and second patterned layers by the first and second lithographic apparatus respectively;

determining a crosstalk characteristic between first and second parameters of the second features exposed by the second lithographic apparatus;

determining first and second control values to be used in exposures of the first features by the first lithographic apparatus, wherein the first and second control values are effective to pre-bias at least one of the first and second parameters in the first features so as to achieve a value of a characteristic of at least one of the first and second features that is not achievable using control inputs of the second lithographic apparatus alone.

BRIEF DESCRIPTION OF THE DRAWINGS/FIGURES

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
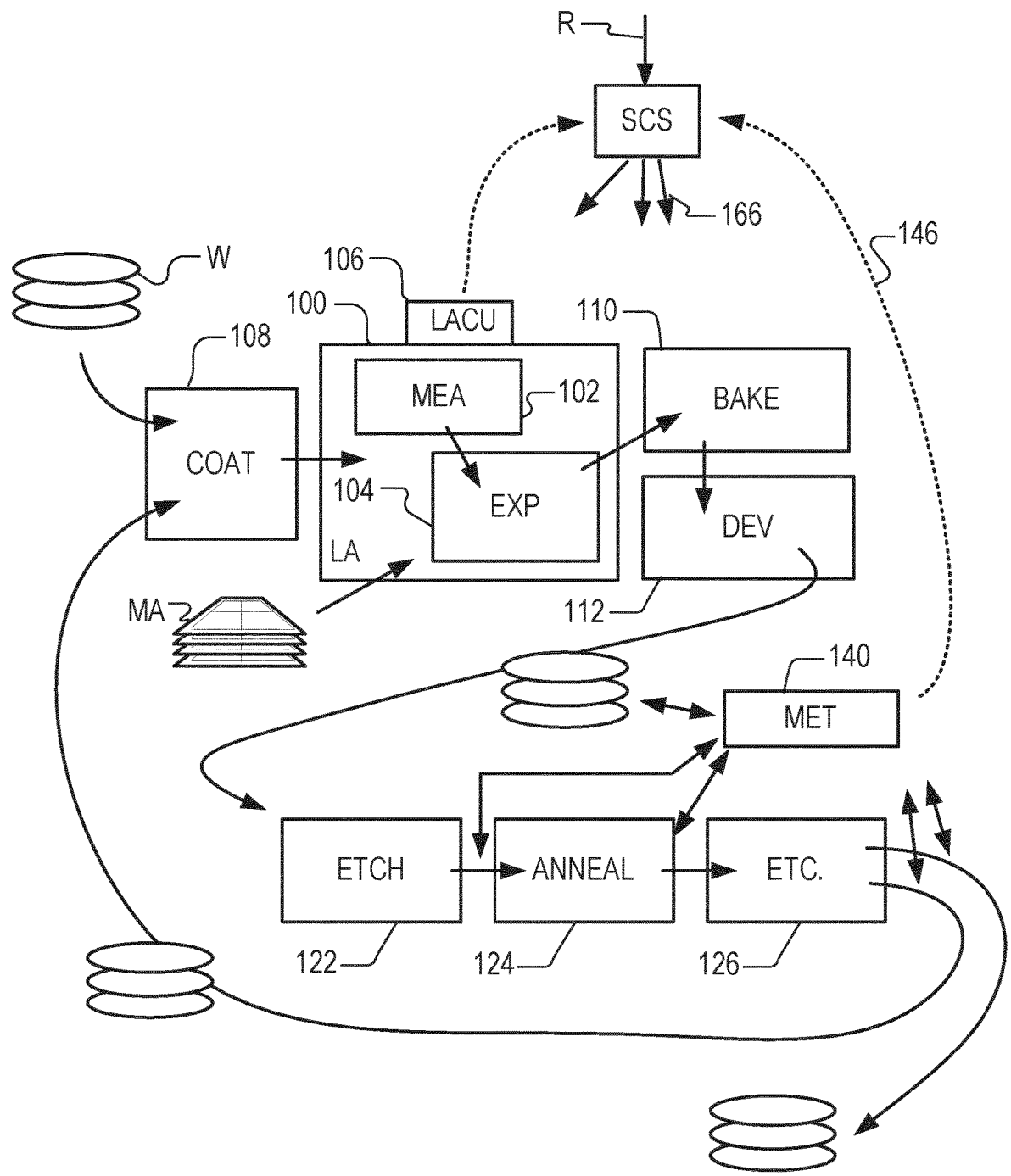
FIG. 1 depicts a lithographic apparatus together with other apparatuses forming a production facility for semiconductor devices.

FIG. 1 illustrates a typical layout of a semiconductor production facility. A lithographic apparatus 100 applies a desired pattern onto a substrate. A lithographic apparatus is used, for example, in the manufacture of integrated circuits (ICs). In that instance, a patterning device MA, which is alternatively referred to as a mask or a reticle, comprises a circuit pattern of features (often referred to as "product features") to be formed on an individual layer of the IC. This pattern is transferred onto a target portion (e.g., comprising part of, one, or several dies) on a substrate 'W' (e.g., a silicon wafer) via exposure 104 of the patterning device onto a layer of radiation-sensitive material (resist) provided on the substrate. In general, a single substrate will contain a network of adjacent target portions that are successively patterned.

Known lithographic apparatus irradiate each target portion by illuminating the patterning device while synchronously positioning the target portion of the substrate at an image position of the patterning device. An irradiated target portion of the substrate is referred to as an "exposure field", or simply "field". The layout of the fields on the substrate is typically a network of adjacent rectangles aligned in accordance to a Cartesian two-dimensional coordinate system (e.g. aligned along an X and an Y-axis, both axes being orthogonal to each other).

A requirement on the lithographic apparatus is an accurate reproduction of the desired pattern onto the substrate. The positions and dimensions of the applied product features need to be within certain tolerances. Position errors may give rise to an overlay error (often referred to as "overlay"). The overlay is the error in placing a first product feature within a first layer relative to a second product feature within a second layer. The lithographic apparatus minimizes the overlay errors by aligning each wafer accurately to a reference prior to patterning. This is done by measuring positions of alignment marks which are applied to the substrate. Based on the alignment measurements the substrate position is controlled during the patterning process in order to prevent occurrence of overlay errors. Alignment marks are typically created as part of the product image forming the reference to which overlay is measured. Alternatively alignment marks of a previously formed layer can be used.

An error in a critical dimension (CD) of the product feature may occur when the applied dose associated with the exposure 104 is not within specification. For this reason the lithographic apparatus 100 must be able to accurately control the dose of the radiation applied to the substrate. CD errors may also occur when the substrate is not positioned correctly with respect to a focal plane associated with the pattern image. Focal position errors are commonly associated with non-planarity of a substrate surface. The lithographic apparatus minimizes these focal positon errors by measuring the substrate surface topography using a level sensor prior to patterning. Substrate height corrections are applied during subsequent patterning to assure correct imaging (focusing) of the patterning device onto the substrate.

To verify the overlay and CD errors associated with the lithographic process the patterned substrates are inspected by a metrology apparatus 140. A common example of a metrology apparatus is a scatterometer. The scatterometer conventionally measures characteristics of dedicated metrology targets. These metrology targets are representative of the product features, except that their dimensions are typically larger in order to allow accurate measurement. The scatterometer measures the overlay by detecting an asymmetry of a diffraction pattern associated with an overlay metrology target. Critical dimensions are measured by analysis of a diffraction pattern associated with a CD metrology target. A CD metrology target is used for measuring the result of the most recently exposed layer. An overlay target is used for measuring the difference between the positions of the previous and most recent layers. Another example of a metrology tool is an electron beam (e-beam) based inspection tool such as a scanning electron microscope (SEM).

Within a semiconductor production facility, lithographic apparatus 100 and metrology apparatus 140 form part of a "litho cell" or "litho cluster". The litho cluster comprises also a coating apparatus 108 for applying photosensitive resist to substrates W, a baking apparatus 110, a developing apparatus 112 for developing the exposed pattern into a physical resist pattern, an etching station 122, apparatus 124 performing a post-etch annealing step and possibly further processing apparatuses, 126, etc. The metrology apparatus is configured to inspect substrates after development (112) or after further processing (e.g. etching). The various apparatus within the litho cell are controlled by a supervisory control system SCS, which issues control signals 166 to control the lithographic apparatus via lithographic apparatus control unit LACU 106 to perform recipe R. The SCS allows the different apparatuses to be operated giving maximum throughput and product yield. An important control mechanism is the feedback 146 of the metrology apparatus 140 to the various apparatus (via the SCS), in particular to the lithographic apparatus 100. Based on the characteristics of the metrology feedback corrective actions are determined to improve processing quality of subsequent substrates.

The performance of a lithographic apparatus is conventionally controlled and corrected by methods such as advanced process control (APC) described for example in US2012008127A1. The advanced process control techniques use measurements of metrology targets applied to the substrate. A Manufacturing Execution System (MES) schedules the APC measurements and communicates the measurement results to a data processing unit. The data processing unit translates the characteristics of the measurement data to a recipe comprising instructions for the lithographic apparatus. This method is very effective in suppressing drift phenomena associated with the lithographic apparatus.

The processing of metrology data to corrective actions performed by the processing apparatus is important for semiconductor manufacturing. In addition to the metrology data also characteristics of individual patterning devices, substrates, processing apparatus and other context data may be needed to further optimize the manufacturing process. The framework wherein available metrology and context data is used to optimize the lithographic process as a whole is commonly referred to as part of holistic lithography. For example context data relating to CD errors on a reticle may be used to control various apparatus (lithographic apparatus, etching station) such that said CD errors will not affect the yield of the manufacturing process. Subsequent metrology data may then be used to verify the effectiveness of the control strategy and further corrective actions may be determined.

In the manufacture of semiconductor devices, accuracy of layer-to-layer positioning is important and limitations on tolerable overlay are becoming ever stricter with the continual desire in the industry to form smaller features. A variety of control and compensation systems exist to minimize overlay, especially overlay due to causes internal to the lithographic apparatus. In addition, overlay can be caused by process steps such as etching, deposition, polishing (CMP) and annealing. These, and potentially other, process steps can cause global and local distortions of the substrate, especially if the substrate is stressed when the process step is performed. It is difficult to control and reduce these distortions.

It is known to measure distortions of a substrate, e.g. by measuring the relative positions of alignment marks, after a process step and to apply corrections in the patterning of subsequent layers on that substrate. In effect, subsequent layers are deliberately shifted and/or distorted to match the distortion caused on previous layers by the process steps. The resulting distortions in the finished device are usually not critical to its functioning in the way that misalignment of layers would be.

Various different types of lithography apparatus are known. Optical lithography apparatus are often characterized by the wavelength of exposure radiation (or equivalently its source)—e.g. 248 nm (KrF), 193 nm (ArF) or EUV—and whether or not it is of the immersion type. Apparatus using shorter wavelengths, or of the immersion type, can image features with higher resolution and/or with tighter tolerances of various characteristics, but are generally more expensive to own and operate. Since in most cases not all layers of a device are equally critical, different layers of a device may be imaged using different types of lithographic apparatus. The different lithographic apparatus may not all have the same capabilities to apply pattern corrections to compensate for parameters such as overlay, dose, focus, etc. Therefore, the known feedback control mechanism may not be able to provide adequate compensation for errors in all circumstances. In other cases, a high performance lithographic apparatus may be used to pattern a layer that does not of itself require such a machine in order to achieve a matched characteristic, e.g. overlay, with another layer that does require to be patterned on a high performance lithographic apparatus. That is not an efficient use of the lithographic apparatus.

In high volume manufacturing, it is common to select different types of lithographic apparatus to use for different layers of a device, accounting for varying overlay requirements of different layers, while simultaneously minimizing costs. For example, implant layers usually have lower demand regarding resolution and overlay as compared to patterning layers typically encountered in front end device processing. To minimize overlay between layers patterned with different lithographic apparatus it is common to "match" the lithographic apparatus. This process is often called machine-to-machine matching and may be done using the available manipulators on the lithographic apparatuses by the fab host computer sending corrections to the lithographic apparatus. There are also off-the-shelf software products. The effort spend on matching greatly depends on required tolerances: in extreme cases multiple consecutive layers are exposed on the same lithographic apparatus to guarantee utmost overlay performance. This approach has huge impact on manufacturing flexibility and reduces overall fab efficiency. Ideally, lithographic apparatus are matched using available manipulators so that as far as possible different layers can be exposed on different lithographic apparatus. Matching between EUV systems and ArF immersion systems is described in David Laidler, Koen D'havé, Jan Hermans, Shaunee Cheng, "Mix and match overlay optimization strategy for advanced lithography tools (193i and EUV)," Proc. SPIE 8326, Optical Microlithography XXV, (2012).

Tightening requirements on overlay and machine-to-machine matching have led to an increase of functionalities implemented into lithographic apparatus to improve overlay and matching capabilities, i.e. more and higher order control inputs are available on most recent scanners. However, it is generally not possible to retrofit additional control inputs to existing lithographic apparatus. Thus, differences in capabilities of different lithographic apparatus have to be accounted for in volume manufacturing fabs where different lithographic apparatus are used to manufacture a given device. The recent introduction of EUV platforms further complicates the situation. Although EUV lithographic apparatus are capable of imaging at higher resolution than DUV lithographic apparatus and in many respects have much better performance, certain intrafield control inputs are not possible since EUV projection systems use mirrors. Intrafield overlay corrections are realized in DUV lithographic apparatus by manipulating lens elements and/or wafer or reticle stage movements which implies that limitations for all three will affect availability and range of correctable parameters.

The present invention aims to improve intrafield and/or field-to-field, i.e. interfield, matching between lithographic apparatus of different types and having different control inputs affecting different sets of correctable parameters. Control inputs in a lithographic apparatus are often referred to as manipulators. A control input may have a direct relationship with a simple physical actuator of the apparatus, for example a control input relating to stage position may directly drive an actuator that moves the stage. In other cases there may be a more complex relationship between the control input and actuators in the lithographic apparatus. For example to give effect to a control input relating to a specific lens aberration parameter may require multiple adjustments by multiple actuators and may also affect other parameters. Thus there may be a many-to-many relationship between control inputs and actuator settings. Such control inputs are sometimes referred to as virtual control knobs.

In summary, embodiments of the invention can move non-correctable parameters, i.e. certain parameters of a certain layer in a product stack that are exposed by a lithographic apparatus lacking a control input that independently affects those parameters, to layers exposed by apparatus where these parameters (or corresponding parameters) are correctable. This may be described as vertically redistributing correctables. The invention is therefore especially useful when certain layers have to be exposed by certain lithographic apparatus because of capability, cost, productivity or other reasons.

One approach to the basic problem is to 'pre-bias' exposures in the layer performed by the lithographic apparatus having the largest set of correctable parameters such that an alteration of any of the non-correctable parameters on the lithographic apparatus having a reduced set of correctable parameters would not be needed. This could be realized when setting up the first layer of a given device assuming this layer would be exposed with the most flexible lithographic apparatus used for the product layer stack. A downside of this approach might be that any drifts arising during processing, e.g. 1) due to lens heating, 2) wafer heating, 3) process drift, 4) control loop noise, etc., cannot be compensated on the system with the reduced set of correctable parameters.

Instead, embodiments of the present invention make use of the fact that correctable parameters are often coupled to various degrees. This is illustrated in the following example showing a known overlay correction model:

$$\begin{pmatrix} dx \\ dy \end{pmatrix}_{i,j} = \begin{pmatrix} k_1 + k_3 x + k_5 y + k_7 x^2 + k_9 xy + k_{11} y^2 + k_{13} x^3 + k_{15} x^2 y + \\ k_{17} xy^2 + k_{19} y^3 \\ k_2 + k_4 y + k_6 x + k_8 y^2 + k_{10} yx + k_{12} x^2 + k_{14} y^3 + k_{16} y^2 x + \\ k_{18} yx^2 + k_{20} x^3 \end{pmatrix}_{i,j} \quad (1)$$

Where dx, dy denote a certain overlay error at a given point i,j on the wafer. Coupling can occur now for example between some orders p and k, i.e. $k_n x^p + \ldots + k_m x^q$ when $$k_m = f(k_n) \approx \frac{\partial k_m}{\partial k_n} \text{ and } k_n = f(k_m) \approx \frac{\partial k_n}{\partial k_m} \quad (2)$$

so that k-parameters are mutually coupled, assuming a linear relationship between $k_n$ and $k_m$.

Figure 3:
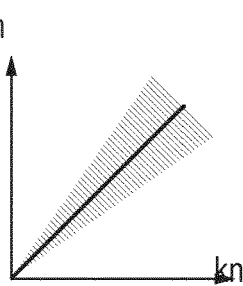
FIG. 3 depicts correlation between errors.

For $$\frac{\partial k_m}{\partial k_n}, \frac{\partial k_n}{\partial k_m} \to 0$$

or ∞ coupling disappears, i.e. $k_n$ and $k_m$ are practically decoupled. Preferred coupling is encountered for $$\frac{\partial k_m}{\partial k_n} = \frac{\partial k_n}{\partial k_m} \approx 1$$

and around 1 as depicted in FIG. 3.

Coupling can occur not only between orders as above, but also between directions x and y. The amount and type of coupling depends specifically on the type of lithographic apparatus being used. For applying the approach described, preferred coupling is desirable, as it helps to avoid having to dial in excessively large corrections for single parameters.

Figure 2:
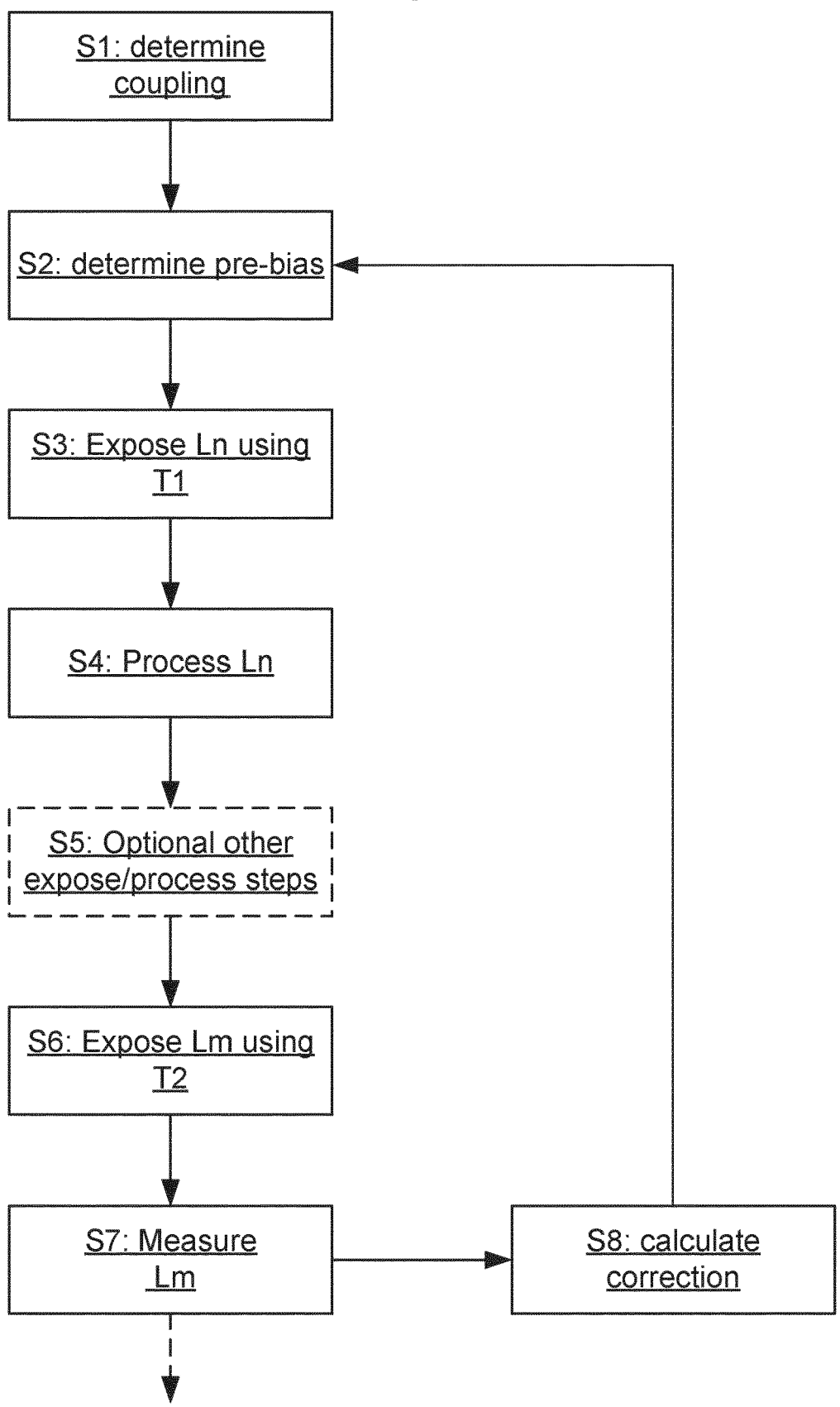
FIG. 2 depicts a flow chart of a method according to an embodiment of the invention.

A process according to an embodiment of the present invention is depicted in FIG. 2. This process uses a first lithographic apparatus T1 and a second lithographic apparatus T2, wherein the first lithographic apparatus is more "flexible" than the second lithographic apparatus. In this context this means that the first lithographic apparatus has at least one control input that is capable of correcting a parameter which the second lithographic apparatus is not capable of independently correcting. In an embodiment, the first lithographic apparatus has first and second control inputs to at least partially independently control first and second parameters whilst the second lithographic apparatus has a third control input that affects both the first and second parameters in a coupled manner. In an embodiment more than two parameters may be coupled and pre-biasing may be applied in more than one parameter.

An initial step is to determine S1 the coupling between the first and second parameters in the second lithographic apparatus. The coupling can be determined empirically, by exposing substrates at different settings of the control input and measuring the results; theoretically; or by simulation. Determination of the coupling may be determined once or may be repeated periodically or as required if it is subject to drift or causes of change.

Figure 4:
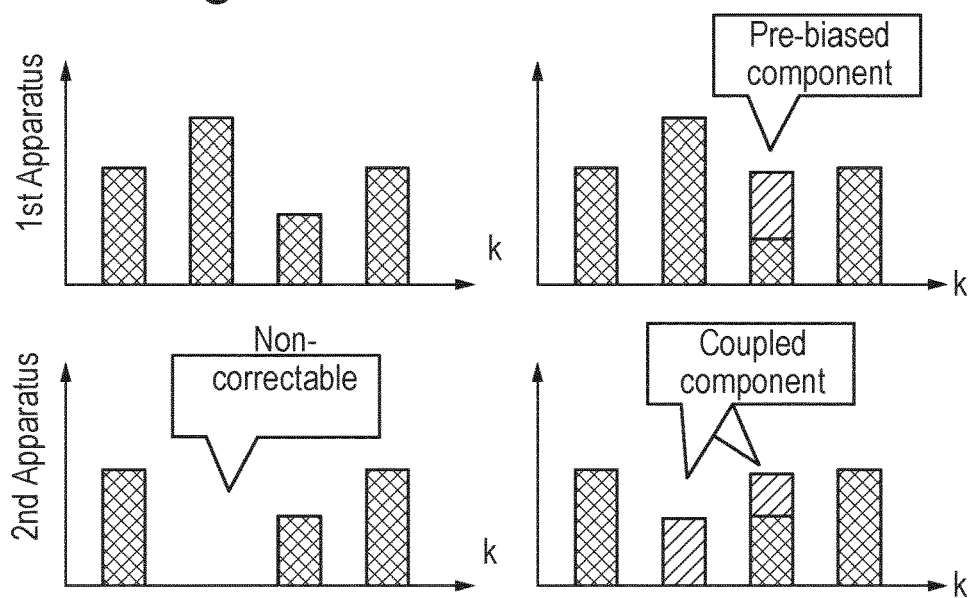
FIG. 4 depicts the use of coupled manipulators to correct different error patterns.

The next step is to determine S2 pre-biasing to be applied in the first lithographic apparatus (having the most extensive correctable set) with one of the, e.g. two, coupled parameters. This is illustrated in FIG. 4 which shows parameters in the first lithographic apparatus in the top row and those in the second lithographic apparatus in the bottom row. The left graphs indicate parameters in the absence of the invention and the right graphs those in the invention. As indicated, a first parameter is non-correctable in the second apparatus but is coupled to a second parameter that is correctable in the second lithographic apparatus. The respective other correctable evolves as ancillary component and is used to compensate for the originally uncorrectable parameter.

A first layer Ln is exposed S3 using the first lithographic apparatus T1 (which is the more flexible one) with the determined pre-bias. The first layer is developed and transferred S4 into the substrate using appropriate process steps, such as implantation or etching. Optionally other layers may be exposed and processed S5 in the usual manner.

A second layer Lm is exposed (S6) using the second (less flexible) lithographic apparatus T2. In this exposure step a correction is applied in the second parameter, which is coupled to the first parameter, and so causes a correction in that first parameter. This results in an improvement in a desirable characteristic of the device, e.g. the relative position of features of the two layers. For control purposes, measurements S7 can be performed on the second layer Lm and corrections calculated S8 and fed back to the determination of pre-bias to be applied in the exposure of subsequent substrates. In this way, drift or other changes in the coupling of the parameters in the second lithographic apparatus can be accounted for.

An example of specific parameters to which the invention can be applied is certain overlay terms which are not controllable by the user in certain lithographic apparatus. Determination of coupling parameters can be done straightforwardly by the user utilizing (ideally) a perfectly straight reference wafer or matching wafer with etched marks having a dense intra-field layout and an appropriate metrology tool.

An application example for this approach would be utilizing k12 and k13 coupling on EUV systems to introduce some correction potential for k13 on EUV systems. This would require a pre-biasing of previous layers with k12, so that on the EUV system a k12 correction would need to be applied and simultaneously a k13 component, perhaps coming from lens heating, wafer heating, etc., would be tackled. Note, that k12 and k13 couple across different directions, so especially for uni-directional DRAM or NAND layers this would be an option to control k13. Similar situations are also encountered in LOGIC devices where a certain direction on a layer has smaller margins than the other and a balancing act could be performed. Another pair of overlay parameters with which the invention can be used is k7 and k20.

Figure 5:
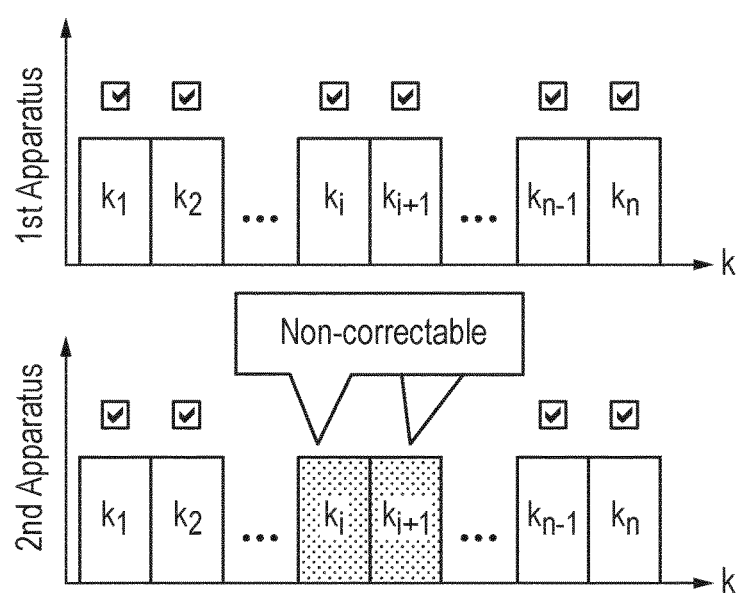
FIG. 5 depicts correctable and uncorrectable parameters in different types of lithographic apparatus.

Another application example for using vertical distribution of correctables would be when having to match legacy, e.g. KrF (248 nm), platforms with more recent systems, e.g. ArF (193 nm) dry or immersion. For the KrF systems certain correctables might not be available at all, which could be re-compensated by exploiting parameter coupling on KrF and the more flexible recent exposure platforms. This follows the same pattern as sketched FIG. 5, where the correction capability gap for ki and ki+1 would need to be closed on KrF.

Another example case where the invention can be applied is matching of focus related parameters between EUV and DUV lithographic apparatus. Focus can be regarded as a z-position error and, as for x and y, many parameters are only weakly coupled, some are strongly coupled and quite a few not at all.

Of focus related parameters there is most coupling between:
  rotation about the x axis (Rx) and field curvature (FC)
  rotation about the y axis (Ry) and astigmatism offset, i.e. constant astigmatism across slit along x (Ast_0) and astigmatism curvature, i.e. second order astigmatism across slit along x (Ast_2)
  focus (z) and Ast_0

These couplings on EUV are more pronounced than for DUV lenses because of the lack of manipulators in the EUV projection optics box, only four out of the five mirrors can be moved, and the curved slit, which is creates manipulation opportunities via moving wafer and reticle stage but also contributes to strong coupling between certain parameters.

One particular aspect of control loop operation in conjunction with above approach needs to emphasized: parameter coupling works in both ways: on the lithographic apparatus T2 with low correction flexibility a correctable parameter ki is assumed to be linked to a non-correctable one, kj. This means it is desirable that the control loop does not vary ki on previous layers, since lithographic apparatus T2 would follow the previous layers, thus unintendedly introducing a contribution to parameter kj.

Thus, embodiments utilize system properties which are undesired, but prevalently exist in the lithographic apparatus. In particular, embodiments allow to optimize mix-and-match overlay (MMO)—the overlay performance obtained using different lithographic apparats for printing different layers on a given substrate. The present invention does not work around certain machine properties, but uses them to the benefit of on-product performance.

An embodiment of the present invention may encompass some or all of the following steps:
  Determine cross-talk components (e.g. via on wafer test—test design customized to the needed correctable parameters—or alternatively from simulations, purely software based)
  Determine the amount of pre-biasing needed and to be applied on the more flexible lithographic apparatus
  Apply the ancillary parameters on less flexible tool
  Optionally, since coupling may occur between more than two parameters, some iterative balancing/optimization might be needed
  Confirm the gain Thus the present invention can address a lack of intrafield overlay correction parameters for certain lithographic apparatus, reducing the risk of having non-correctable components remaining on product.

It is noted that in some cases the pre-bias applied to the correctable parameter may be detrimental to performance in relation to that metric, for example by increasing overlay in one direction even though overlay in the orthogonal direction is improved. However, in many cases one parameter may be more important than others, for example in exposing long lines overlay in the direction perpendicular to the lines is more important than overlay in the parallel direction. The present invention can be applied where the uncorrectable parameter in the second lithographic apparatus.

Further embodiments of the invention are disclosed in the list of numbered clauses below:
1. A device manufacturing method comprising:
  performing a first exposure on a substrate using a first lithographic apparatus to form a first patterned layer comprising first features;
  processing the substrate to transfer the first features into the substrate; and
  performing a second exposure on the substrate using a second lithographic apparatus to form a second patterned layer comprising second features; wherein:
  the first lithographic apparatus has first and second control inputs effective to control first and second parameters of the first features at least partly independently;
  the second lithographic apparatus has a third control input effective to control the first and second parameters of the second features together; and
  the first exposure is performed with at least one of the first and second control inputs set to pre-bias at least one of the first and second parameters so as to achieve a value of a characteristic of at least one of the first and second features that is not achievable using the third control input alone.
2. A method according to clause 1, wherein the characteristic is overlay between the first and second features.
3. A method according to clause 2 wherein the parameters are intra-field overlay parameters.
4. A method according to clause 1 wherein the parameters are focus-related parameters.
5. The method according to any one of the preceding clauses, wherein at least one of the first, second and third control inputs is configured to control an optical manipulator of a projection system.
6. A method according to any one of the preceding clauses, wherein the at least one of the first, second and third control inputs is configured to control the position, orientation and/or trajectory of a substrate stage or a support structure for a patterning means.
7. A method according to any one of the preceding clauses, wherein the first lithographic apparatus uses exposure radiation having a first wavelength and the second lithographic apparatus uses exposure radiation having a second wavelength, the second wavelength being different from the first wavelength.
8. A method according to clause 7, wherein the first wavelength is 193 nm and the second wavelength is 248 nm or in the range of from 4 to 20 nm.
9. A computer program comprising computer-readable code means that, when executed by a computer system are effective to control first and second lithographic apparatus to perform a method according to any one of the preceding clauses.
10. A method for determining parameters to be used in device manufacturing process in which a first exposure is performed on a substrate using a first lithographic apparatus to form a first patterned layer comprising first features and a second exposure is performed on the substrate using a second lithographic apparatus to form a second patterned layer comprising second features, the method comprising:
  obtaining metrology data relating to exposures of the first and second patterned layers by the first and second lithographic apparatus respectively;
  determining a crosstalk characteristic between first and second parameters of the second features exposed by the second lithographic apparatus;
  determining first and second control values to be used in exposures of the first features by the first lithographic apparatus, wherein the first and second control values are effective to pre-bias at least one of the first and second parameters in the first features so as to achieve a value of a characteristic of at least one of the first and second features that is not achievable using control inputs of the second lithographic apparatus alone.
11. A method according to clause 10, wherein the characteristic is overlay between the first and second features.
12. A method according to clause 11 wherein the parameters are intra-field overlay or inter-field overlay parameters.
13. A method according to clause 12 wherein the overlay parameters are coefficients of second- and/or third-order terms in a spatial model of overlay.
14. The method according to any one of clauses 10 to 13, wherein the second lithographic apparatus does not have independent control of the first and second parameters.
15. A method according to any one of clauses 10 to 14, further comprising obtaining further metrology data relating to exposures performed using the first and second control values and determining adjusted first and second control values based on the further metrology data.

While specific embodiments of the invention have been described above, it will be appreciated that the invention may be practiced otherwise than as described.

An embodiment may include a computer program containing one or more sequences of machine-readable instructions configured to instruct various apparatus as depicted in FIG. 1 to perform measurement and optimization steps and to control a subsequent exposure process as described above. This computer program may be executed, for example, within the control unit LACU or the supervisory control system SCS of FIG. 1 or a combination of both. There may also be provided a data storage medium (e.g., semiconductor memory, magnetic or optical disk) having such a computer program stored therein.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A device manufacturing method comprising:
performing a first exposure on a substrate using a first lithographic apparatus to form a first patterned layer comprising first features;
processing the substrate to transfer the first features into the substrate; and
performing a second exposure on the substrate using a second lithographic apparatus to form a second patterned layer comprising second features, wherein:
the first lithographic apparatus has first and second control inputs effective to control first and second parameters of the first features at least partly independently;
the second lithographic apparatus has a third control input effective to control the first and second parameters of the second features together; and
the first exposure is performed with the first and/or second control input set to pre-bias the first and/or second parameter so as to achieve a value of a characteristic of the first and/or second features that is not achievable using the third control input alone.

2. The method according to claim 1, wherein the characteristic is overlay between the first and second features.

3. The method according to claim 2, wherein the parameters are intra-field overlay parameters.

4. The method according to claim 1, wherein the parameters are focus-related parameters.

5. The method according to claim 1, wherein at least one selected from the first, second and/or third control inputs is configured to control an optical manipulator of a projection system.

6. The method according to claim 1, wherein at least one from the first, second and/or third control inputs is configured to control the position, orientation and/or trajectory of a substrate stage or a support structure for a patterning means.

7. The method according to claim 1, wherein the first lithographic apparatus uses exposure radiation having a first wavelength and the second lithographic apparatus uses exposure radiation having a second wavelength, the second wavelength being different from the first wavelength.

8. The method according to claim 7, wherein the first wavelength is 193 nm and the second wavelength is 248 nm or in the range of from 4 to 20 nm.

9. A computer program product comprising a non-transitory computer-readable medium having computer-readable code therein that, when executed by a computer system, is effective to control first and second lithographic apparatuses to perform the method according to claim 1.

10. A method for determining parameters to be used in device manufacturing process in which a first exposure is performed on a substrate using a first lithographic apparatus to form a first patterned layer comprising first features and a second exposure is performed on the substrate using a second lithographic apparatus to form a second patterned layer comprising second features, the method comprising:
obtaining metrology data relating to exposures of the first and second patterned layers by the first and second lithographic apparatus respectively;
determining a crosstalk characteristic between first and second parameters of the second features exposed by the second lithographic apparatus; and
determining first and second control values to be used in exposures of the first features by the first lithographic apparatus,
wherein the first and second control values are effective to pre-bias the first and/or second parameter in the first features so as to achieve a value of a characteristic of the first and/or second features that is not achievable using control inputs of the second lithographic apparatus alone.

11. The method according to claim 10, wherein the characteristic is overlay between the first and second features.

12. The method according to claim 11, wherein the parameters are intra-field overlay or inter-field overlay parameters.

13. The method according to claim 12, wherein the overlay parameters are coefficients of second- and/or third-order terms in a spatial model of overlay.

14. The method according to claim 10, wherein the second lithographic apparatus does not have independent control of the first and second parameters.

15. The method according to claim 10, further comprising obtaining further metrology data relating to exposures performed using the first and second control values and determining adjusted first and second control values based on the further metrology data.

16. A computer program product comprising a non-transitory computer-readable medium having computer-readable code therein that, when executed by a computer system, is effective to cause the computer system to perform the method according to claim 10.

17. The computer program product according to claim 16, wherein the characteristic is overlay between the first and second features.

18. The computer program product according to claim 17, wherein the parameters are intra-field overlay or inter-field overlay parameters.

19. The computer program product according to claim 16, wherein the second lithographic apparatus does not have independent control of the first and second parameters.

20. The computer program product according to claim 16, wherein the code is further configured to cause the computer to obtain further metrology data relating to exposures performed using the first and second control values and determine adjusted first and second control values based on the further metrology data.

* * * * *